(12) United States Patent
Umeda et al.

(10) Patent No.: US 10,608,164 B2
(45) Date of Patent: Mar. 31, 2020

(54) PIEZOELECTRIC THIN FILM, MANUFACTURING METHOD THEREFOR, AND PIEZOELECTRIC ELEMENT

(71) Applicants: Murata Manufacturing Co., Ltd., Nagaokakyo-shi, Kyoto-fu (JP); NATIONAL INSTITUTE OF ADVANCED INDUSTRIAL SCIENCE AND TECHNOLOGY, Chiyoda-ku, Tokyo (JP)

(72) Inventors: Keiichi Umeda, Nagaokakyo (JP); Atsushi Honda, Nagaokakyo (JP); Morito Akiyama, Tosu (JP); Keiko Nishikubo, Tosu (JP); Toshimi Nagase, Tosu (JP)

(73) Assignees: MURATA MANUFACTURING CO., LTD., Nagaokakyo-Shi, Kyoto-Fu (JP); NATIONAL INSTITUTE OF ADVANCED INDUSTRIAL SCIENCE AND TECHNOLOGY, Chiyoda-Ku, Tokyo (JP)

( * ) Notice: Subject to any disclaimer, the term of this patent is extended or adjusted under 35 U.S.C. 154(b) by 722 days.

(21) Appl. No.: 15/149,519

(22) Filed: May 9, 2016

(65) Prior Publication Data
US 2016/0254438 A1      Sep. 1, 2016

Related U.S. Application Data

(63) Continuation of application No. PCT/JP2014/080799, filed on Nov. 20, 2014.

(30) Foreign Application Priority Data

Nov. 29, 2013    (JP) ................. 2013-248079

(51) Int. Cl.
    *H01L 41/18*       (2006.01)
    *H04R 17/02*       (2006.01)
    (Continued)

(52) U.S. Cl.
    CPC ........ *H01L 41/183* (2013.01); *C23C 14/0036* (2013.01); *C23C 14/3414* (2013.01);
    (Continued)

(58) Field of Classification Search
    CPC . H01L 41/183; H01L 41/187; C23C 14/0036; C23C 14/3414; C23C 16/34; H03H 3/02; H03H 9/17
    (Continued)

(56) References Cited

U.S. PATENT DOCUMENTS 3,637,506 A * 1/1972 Tanizake ............... C04B 35/472
                                              252/62.9 PZ
3,767,579 A * 10/1973 Tsubouchi ............ C04B 35/493
                                              252/62.9 PZ
(Continued)

FOREIGN PATENT DOCUMENTS

| CN | 103312288 A | 9/2013 |
|----|-------------|--------|
| JP | 2009016859 A | 1/2009 |
| JP | 2013219743 A | 10/2013 |

OTHER PUBLICATIONS

International Search Report issued for PCT/JP2014/080799, dated Feb. 10, 2015.
(Continued)

*Primary Examiner* — Bryan P Gordon
(74) *Attorney, Agent, or Firm* — Arent Fox LLP

(57) ABSTRACT

A piezoelectric thin film composed of aluminum nitride and which contains magnesium and 31 to 120 atomic percent of niobium relative to 100 atomic percent of the magnesium, and the total content of the magnesium and the niobium
(Continued)

relative to the total sum of contents of the magnesium, the niobium and the aluminum nitride falls within the range of 10 to 67 atomic percent.

5 Claims, 8 Drawing Sheets

(51) Int. Cl.
    *H03H 9/17*     (2006.01)
    *H01L 41/187*     (2006.01)
    *H01L 41/316*     (2013.01)
    *H03H 3/02*     (2006.01)
    *C23C 16/34*     (2006.01)
    *C23C 14/00*     (2006.01)
    *C23C 14/34*     (2006.01)

(52) U.S. Cl.
    CPC .......... *C23C 14/3464* (2013.01); *C23C 16/34* (2013.01); *H01L 41/187* (2013.01); *H01L 41/316* (2013.01); *H03H 3/02* (2013.01); *H03H 9/17* (2013.01); *H04R 17/02* (2013.01); *H04R 2307/027* (2013.01)

(58) Field of Classification Search
    USPC ........................................................ 310/358
    See application file for complete search history.

(56) References Cited

U.S. PATENT DOCUMENTS

| | | | |
|---|---|---|---|
| 5,419,824 A * | 5/1995 | Weres ................ | C02F 1/46109 204/242 |
| 9,087,979 B2 | 7/2015 | Yokoyama et al. | |
| 2013/0241673 A1* | 9/2013 | Yokoyama ......... | H03H 9/02015 333/189 |
| 2014/0167560 A1* | 6/2014 | Onda ................. | H03H 9/02015 310/311 |

OTHER PUBLICATIONS

Written Opinion of the International Searching Authority issued for PCT/JP2014/080799, dated Feb. 10, 2015.

* cited by examiner

PIEZOELECTRIC THIN FILM, MANUFACTURING METHOD THEREFOR, AND PIEZOELECTRIC ELEMENT

CROSS REFERENCE TO RELATED APPLICATIONS

The present application is a continuation of International application No. PCT/JP2014/080799, filed Nov. 20, 2014, which claims priority to Japanese Patent Application No. 2013-248079, filed Nov. 29, 2013, the entire contents of each of which are incorporated herein by reference.

FIELD OF THE INVENTION

The present invention relates to a piezoelectric thin film, a manufacturing method for the piezoelectric thin film and a piezoelectric element including the piezoelectric thin film and first and second electrodes.

BACKGROUND OF THE INVENTION

It has hitherto been known that a higher piezoelectric coefficient is exhibited in a piezoelectric thin film composed of an aluminum nitride containing scandium as compared with a piezoelectric thin film composed of an aluminum nitride containing no scandium. However, scandium is very expensive since scandium is not industrially widely used, and has also been difficult to be stably obtained. As such, research on aluminum nitride containing an element other than scandium have been widely conducted.

For example, the following Patent Document 1 discloses a piezoelectric thin film composed of an aluminum nitride film containing a divalent element and a tetravalent element and an aluminum nitride film containing a divalent element and a pentavalent element. In Patent Document 1, in an aluminum nitride film containing Mg as a divalent element and Zr as a tetravalent element, the enhancement in piezoelectric coefficient of the obtained piezoelectric thin film has been confirmed.

Patent Document 1: JP 2013-219743 A

SUMMARY OF THE INVENTION

However, in Patent Document 1, with regard to the combination of other elements, a simulation result based on the first principle calculation is only described. Since the simulation result presupposes that an ideal atomic model can be constituted, practically, an actual combination thereof has not been constituted and tested. This is because problems of a solid-solubility limit of the atom, structural stability and the like occur practically. Accordingly, from the simulation result in Patent Document 1, it is impossible to know if the composition allows a higher piezoelectric coefficient to be exhibited and enables the piezoelectric thin film to be put into practical use.

An object of the present invention is to provide a piezoelectric thin film composed of an aluminum nitride which contains an inexpensive element other than scandium and has an increased piezoelectric coefficient, a manufacturing method for the piezoelectric thin film and a piezoelectric element including the piezoelectric thin film.

The piezoelectric thin film according to the present invention is composed of an aluminum nitride containing magnesium and niobium, 31 to 120 atomic percent of the niobium is contained therein relative to 100 atomic percent of the magnesium, and the total content of magnesium and niobium relative to the total sum of contents of magnesium, niobium and aluminum falls within the range of 10 to 67 atomic percent.

In a specific aspect of the piezoelectric thin film according to the present invention, the total content of magnesium and niobium falls within the range of 30 to 63 atomic percent.

In another specific aspect of the piezoelectric thin film according to the present invention, 44 to 87 atomic percent of the niobium is contained relative to 100 atomic percent of the magnesium.

In yet another specific aspect of the piezoelectric thin film according to the present invention, the niobium includes pentavalent niobium and tetravalent niobium.

In a manufacturing method for a piezoelectric thin film according to the present invention, the piezoelectric thin film is obtained by using a first target composed of aluminum, a second target composed of magnesium and a third target composed of niobium to perform film-forming by a ternary sputtering method under a nitrogen gas atmosphere.

In another manufacturing method for a piezoelectric thin film according to the present invention, the piezoelectric thin film is obtained by using a target composed of an alloy of aluminum, magnesium and niobium to perform film-forming by a unitary sputtering method under a nitrogen gas atmosphere.

The piezoelectric element according to the present invention includes a piezoelectric thin film constituted according to the present invention and first and second electrodes provided so as to be brought into contact with the piezoelectric thin film.

According to the present invention, it is possible to provide a piezoelectric thin film composed of an aluminum nitride which contains inexpensive magnesium and niobium other than scandium and has an increased piezoelectric coefficient, a manufacturing method therefore and a piezoelectric element including the piezoelectric thin film.

DETAILED DESCRIPTION OF PREFERRED EMBODIMENTS OF THE INVENTION

Hereinafter, embodiments of the present invention will be described with reference to the drawings.

(Piezoelectric Thin Film and Manufacturing Method Therefore)

The present inventors have conducted diligent studies on elements which are inexpensive elements other than scandium (Sc) and can be contained in an aluminum nitride (AlN) to increase the piezoelectric coefficient of a piezoelectric thin film composed of the AlN. As a result, the present inventors have found that, by allowing magnesium (Mg) and niobium (Nb), which are more inexpensive than Sc, in amounts within specific ranges to be contained in an AlN, the piezoelectric coefficient of a piezoelectric thin film composed of the AlN can be enhanced, and thus, the present invention has been completed.

With regard to the specific range, specifically, the Nb content relative to 100 atomic percent of Mg falls within the range of 31 to 120 atomic percent. Moreover, the total content of Mg and Nb relative to the total sum of contents of Mg, Nb and AlN falls within the range of 10 to 67 atomic percent. This will be described in more detail with reference to FIG. 1 to FIG. 5.

Figure 1:
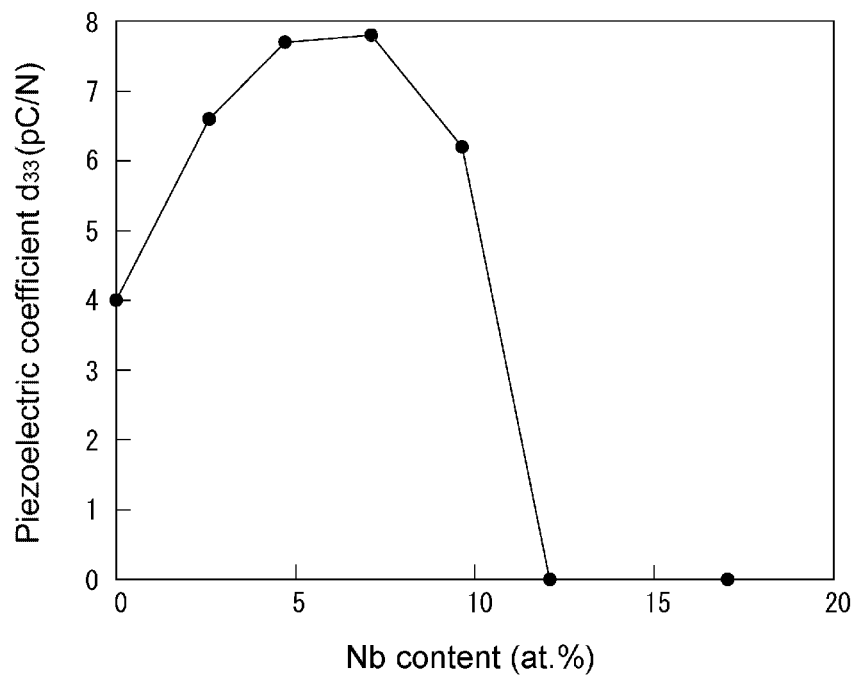
FIG. 1 is a graphical representation showing the relationship between the Nb content and the piezoelectric coefficient $d_{33}$ of an aluminum nitride containing magnesium (Mg) and niobium (Nb) (MgNbAlN) in the case where the Mg content is fixed at 8.1 atomic percent and the Nb content is changed.

FIG. 1 is a graphical representation showing the relationship between the Nb content and the piezoelectric coefficient $d_{33}$ of an aluminum nitride containing Mg and Nb (MgNbAlN) in the case where the Mg content is fixed at 8.1 atomic percent and the Nb content is changed. That is, FIG. 1 is a graphical representation showing the relationship between the Nb content and the piezoelectric coefficient $d_{33}$ in the case where the X value in $(Mg_{0.081}Nb_XAl_{1-0.081-X})N$ is changed.

As shown in FIG. 1, it has been found that the piezoelectric coefficient $d_{33}$ is increased with an increase in the Nb content. In particular, it has been found that the piezoelectric coefficient $d_{33}$ is most increased in the case where the Nb content relative to 8.1 atomic percent of Mg falls within the range of 2.5 to 9.7 atomic percent, and the piezoelectric coefficient $d_{33}$ becomes larger than the piezoelectric coefficient $d_{33}$ of the AlN (=6.0 pC/N).

On the other hand, it has been found that the piezoelectric coefficient $d_{33}$ is decreased in the case where the Nb content is greater than 10 atomic percent and the piezoelectric coefficient $d_{33}$ becomes 0 when the Nb content is greater than or equal to 13 atomic percent.

Figure 2:
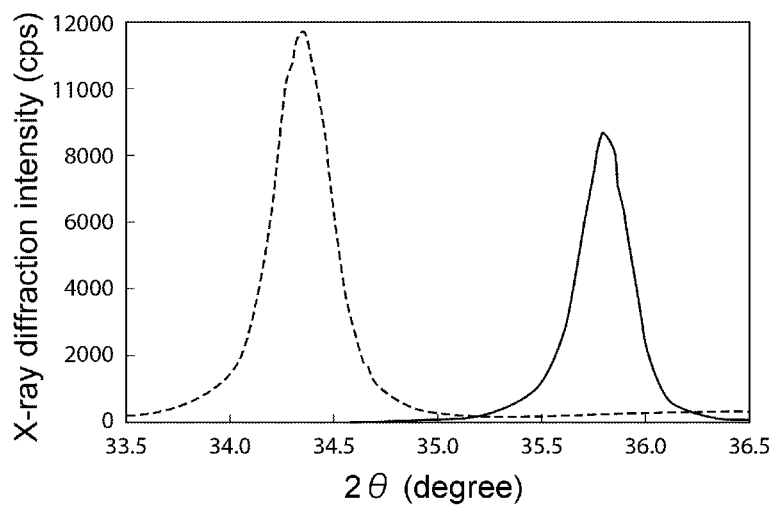
FIG. 2 is an X-ray diffraction profile of an AlN containing Mg and Nb in the case where the Nb content is changed.

In FIG. 2, an X-ray diffraction profile of an AlN containing Mg and Nb in the case where the Nb content is changed is shown. In the figure, a profile obtained in the case where the Nb content in FIG. 1 is 7.1 atomic percent is drawn by the solid line, and a profile obtained in the case where the Nb content in FIG. 1 is 17.1 atomic percent is drawn by the broken line.

As shown in FIG. 2, in the case where the Nb content is 17.1 atomic percent, as compared with the case where the Nb content is 7.1 atomic percent, the diffraction peak is shifted to the narrow angle side. This reveals that phase transition has occurred in the AlN with an Nb content of 17.1 atomic percent. Thus, it has become apparent that, in the case where the Nb content is greater than 9.7 atomic percent, the piezoelectric coefficient $d_{33}$ is sharply decreased due to the above-mentioned phase transition.

Accordingly, in the present invention, by allowing the Nb content relative to 8.1 atomic percent of Mg to fall within the range of 2.5 to 9.7 atomic percent, namely, allowing the Nb content relative to 100 atomic percent of Mg to fall within the range of 31 to 120 atomic percent, it is possible to increase the piezoelectric coefficient $d_{33}$ of a piezoelectric thin film composed of the AlN film.

Figure 3:
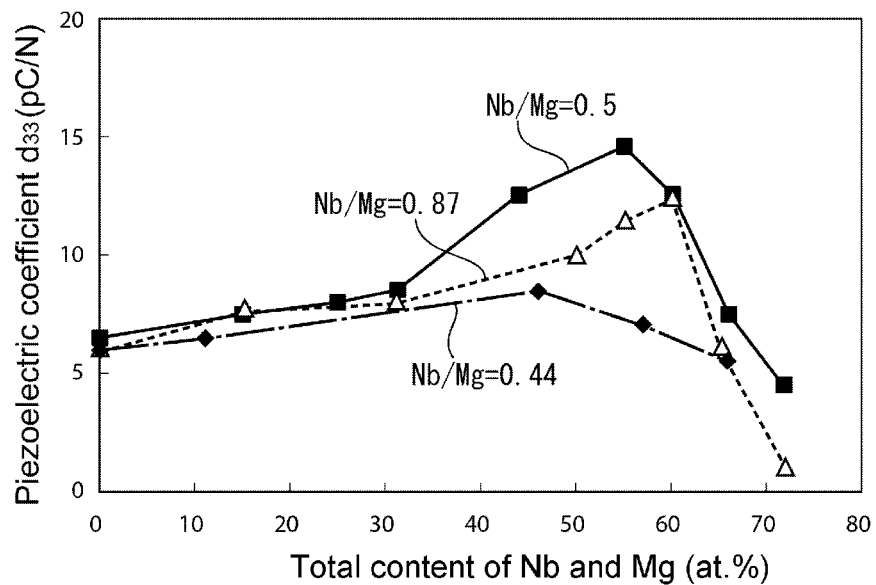
FIG. 3 is a graphical representation showing the relationship between the total content of Mg and Nb and the piezoelectric coefficient $d_{33}$ in the case where the Nb content relative to 100 atomic percent of Mg is set to each of 44 atomic percent, 50 atomic percent and 87 atomic percent and the total content of Mg and Nb is changed.

FIG. 3 is a graphical representation showing the relationship between the total content of Mg and Nb and the piezoelectric coefficient $d_{33}$ in the case where the Nb content relative to 100 atomic percent of Mg is set to each of 44 atomic percent, 50 atomic percent and 87 atomic percent and the total content of Mg and Nb is changed. For example, in the case where the Nb content is set to 50 atomic percent, the graph shows the relationship between the total content of Mg and Nb and the piezoelectric coefficient $d_{33}$ in the case where the Y value in $(Mg_2Nb)_YAl_{1-Y}N$ is changed. The solid line shows a result obtained when the Nb content relative to 100 atomic percent of Mg is set to 50 atomic percent, the broken line shows a result obtained when set to 87 percent, and the alternate long and short dash line shows a result obtained when set to 44 atomic percent.

As shown in FIG. 3, in all the cases where the Nb content relative to 100 atomic percent of Mg is set to 44 atomic percent, 50 atomic percent and 87 atomic percent, it has been found that the piezoelectric coefficient $d_{33}$ is increased with an increase in the total content of Mg and Nb. In particular, it has been found that the piezoelectric coefficient $d_{33}$ is especially increased in the case where the total content of Mg and Nb falls within the range of 10 atomic percent to 67 atomic percent, and the piezoelectric coefficient $d_{33}$ becomes larger than the piezoelectric coefficient $d_{33}$ of the AlN (=6.0 pC/N). When the total content of Mg and Nb falls within the range of 10 atomic percent to 67 atomic percent, the piezoelectric coefficient $d_{33}$ in the case where the Nb content relative to 100 atomic percent of Mg is set to 87 atomic percent is higher than that in the case where the Nb content is set to 44 atomic percent. Furthermore, within the above-mentioned range, the piezoelectric coefficient $d_{33}$ in the case where the Nb content relative to 100 atomic percent of Mg is set to 50 atomic percent is higher than that in the case where the Nb content is set to 87 atomic percent.

On the other hand, it has been found that the piezoelectric coefficient $d_{33}$ is decreased in the case where the total content of Mg and Nb is greater than 67 atomic percent.

Figure 4:
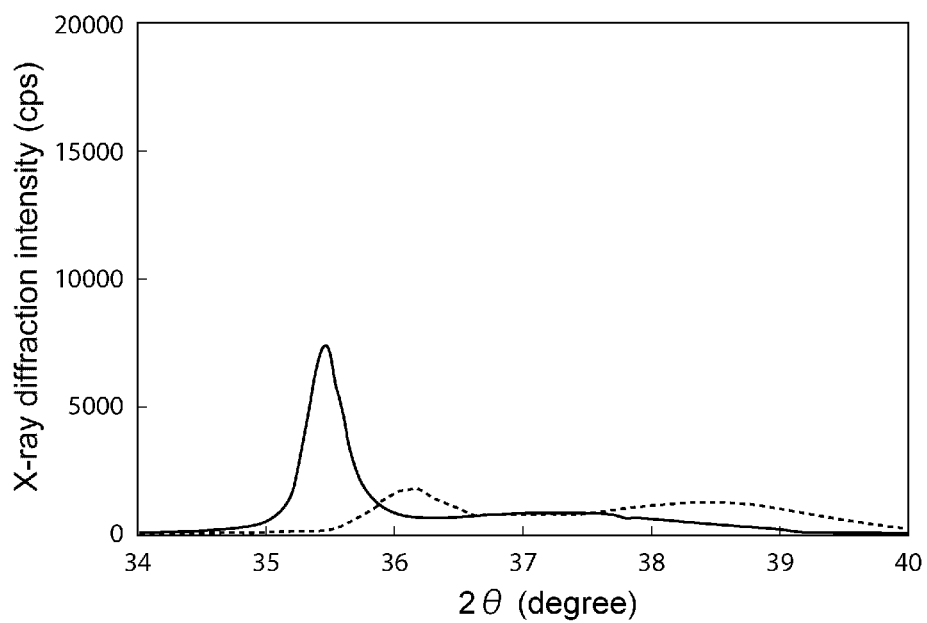
FIG. 4 is an X-ray diffraction profile of an AlN containing Mg and Nb in the case where the total content of Mg and Nb is changed.

In FIG. 4, an X-ray diffraction profile of an AlN containing Mg and Nb in the case where the total content of Mg and Nb is changed is shown. In the figure, a profile obtained in the case where the total content of Mg and Nb in FIG. 3 is 55 atomic percent is drawn by the solid line, and a profile obtained in the case where the total content of Mg and Nb in FIG. 3 is 66 atomic percent is drawn by the broken line.

As shown in FIG. 4, in the case where the total content of Mg and Nb is 66 atomic percent, as compared with the case where the total content of Mg and Nb is 55 atomic percent, the diffraction peak becomes broad. This reveals that the crystal structure of the c-axis oriented film has collapsed in the AlN with a total content of Mg and Nb of 66 atomic percent, and the piezoelectricity is sharply decreased.

Thus, in the present invention, by allowing the total content of Mg and Nb to fall within the range of 10 atomic percent to 67 atomic percent, it is possible to increase the piezoelectric coefficient of a piezoelectric thin film composed of the AlN film. Moreover, as apparent from FIG. 3, when the total content of Mg and Nb is allowed to fall within the range of 30 atomic percent to 63 atomic percent, the piezoelectric coefficient $d_{33}$ is further increased. Thus, it is preferred that the total content of Mg and Nb be 30 atomic percent to 63 atomic percent.

Figure 5:
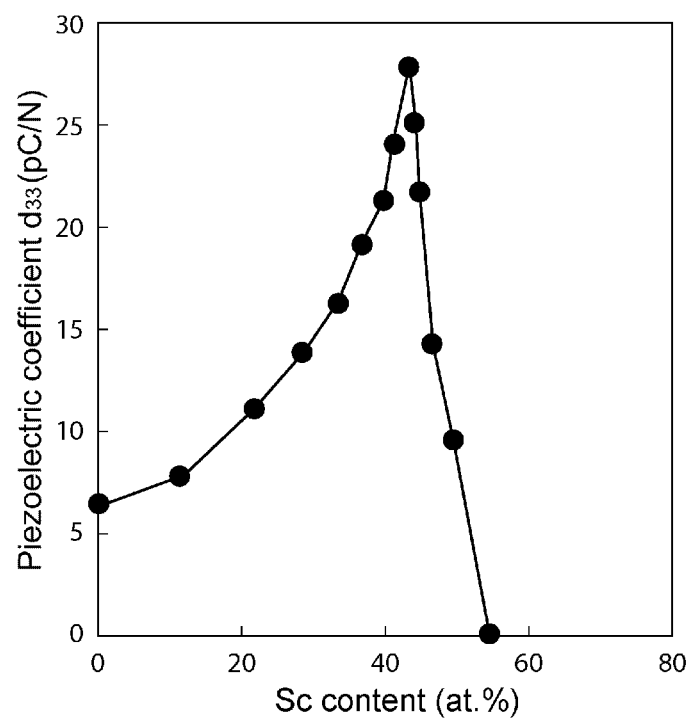
FIG. 5 is a graphical representation showing the relationship between the Sc content and the piezoelectric coefficient $d_{33}$ of a conventional Sc-containing AlN.

As described above, in FIG. 3, with regard to an AlN with a total content of Mg and Nb of greater than or equal to 66 atomic percent, the piezoelectric coefficient $d_{33}$ is sharply decreased. On the other hand, the relationship between the Sc content and the piezoelectric coefficient $d_{33}$ of a conventional Sc-containing AlN is shown in FIG. 5, and in this case, the piezoelectric coefficient $d_{33}$ is sharply decreased when the Sc content is greater than or equal to 50 atomic percent. From this, the fact that, in an Mg and Nb-containing AlN, as compared with an Sc-containing AlN, the piezoelectric coefficient $d_{33}$ is not decreased even when a larger amount of Al is substituted, which cannot be known from the simulation, has become apparent.

Figure 11:
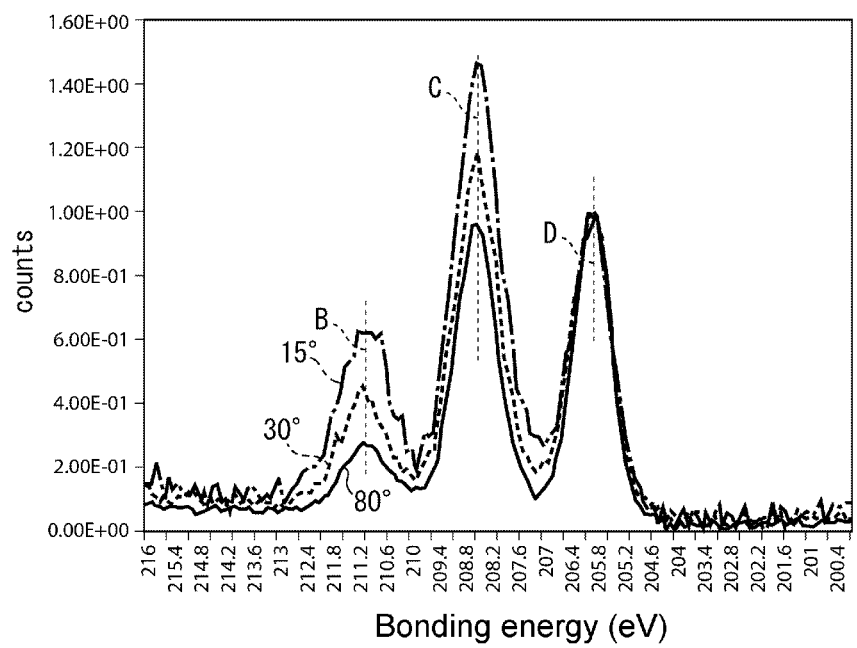
FIG. 11 is a graphical representation showing the analysis results of the piezoelectric thin film according to the present invention by HAXPES (Hard X-ray Photoemission Spectroscopy).

FIG. 11 is a graphical representation showing the analysis results of the piezoelectric thin film according to the present invention by HAXPES (Hard X-ray Photoemission Spectroscopy). An angle between the incident face of X-rays in a piezoelectric thin film to be analyzed and the detector used in HAXPES is defined as a detection angle, and the solid line shows a result obtained when the detection angle is set to 80°. The broken line shows a result obtained when the detection angle is set to 30°, and the alternate long and short dash line shows a result obtained when the detection angle is set to 15°.

In HAXPES, X-rays which are higher in energy than X-rays used in XPS (X-ray Photoelectron Spectroscopy) are used. More specifically, while X-rays used in XPS have an energy of 1 keV or so, X-rays used in HAXPES have an energy of greater than or equal to 8 keV. In XPS, an object can be analyzed only to a depth of a few nm or so from the surface of the object to be analyzed. In contrast, in HAXPES, by using X-rays of high energy, an object can be analyzed to a depth of 30 nm or so from the surface of the object to be analyzed. That is, by HAXPES, it is possible to evaluate a bulky object to be analyzed for the coupling state.

As shown in FIG. 11, in the case where the detection angle is set to 15°, peaks exist at respective positions of bonding energy levels shown by broken lines B, C and D. Similarly, in the case where the detection angle is set to 30° and the case where the detection angle is set to 80°, peaks exist at respective positions of bonding energy levels shown by broken lines B, C and D. The peak at a position of a bonding energy level shown by the broken line B corresponds to a peak derived from pentavalent niobium. The peak at a position of a bonding energy level shown by the broken line C corresponds to a peak derived from pentavalent niobium and tetravalent niobium. The peak at a position of a bonding energy level shown by the broken line D corresponds to a peak derived from tetravalent niobium. Thus, by adopting HAXPES, it has newly become apparent that not only pentavalent niobium but also tetravalent niobium is included in the niobium constituting the piezoelectric thin film. In this connection, as shown in FIG. 11, trivalent niobium is not included in the piezoelectric thin film.

The piezoelectric thin film according to the present invention can be formed by a thin film forming method. Examples of the thin film forming method include a sputtering method, a CVD method and the like, and it is preferred that the piezoelectric thin film be manufactured by a sputtering method. Sputtering is especially preferably performed by means of a ternary sputtering apparatus shown in FIG. 6 or a unitary sputtering apparatus shown in FIG. 7.

Figure 6:
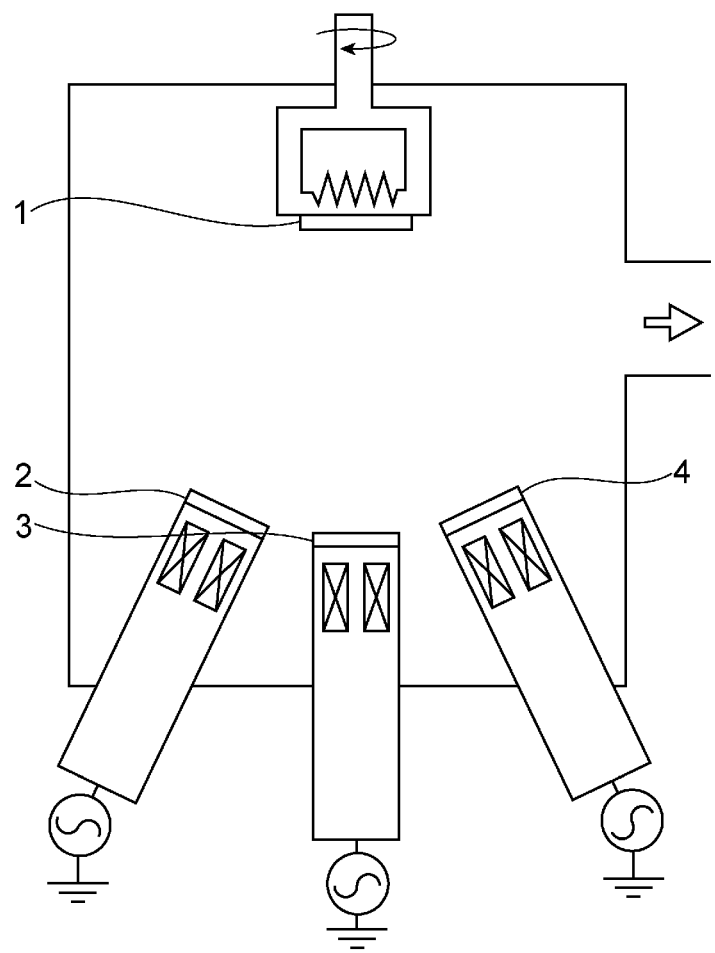
FIG. 6 is a simplified schematic view of an apparatus used at the time of performing film-forming by a ternary sputtering method.

In the sputtering apparatus shown in FIG. 6, a first target 2 composed of Al, a second target 3 composed of Mg and a third target 4 composed of Nb are used to form a film on a substrate 1 by a ternary sputtering method under a nitrogen ($N_2$) gas atmosphere. Moreover, as the first target 2, a target composed of an AlN may be used. In the ternary sputtering method, the adjustment of contents of Al, Mg and Nb can be performed by changing the power ratio to the first, second and third targets.

Figure 7:
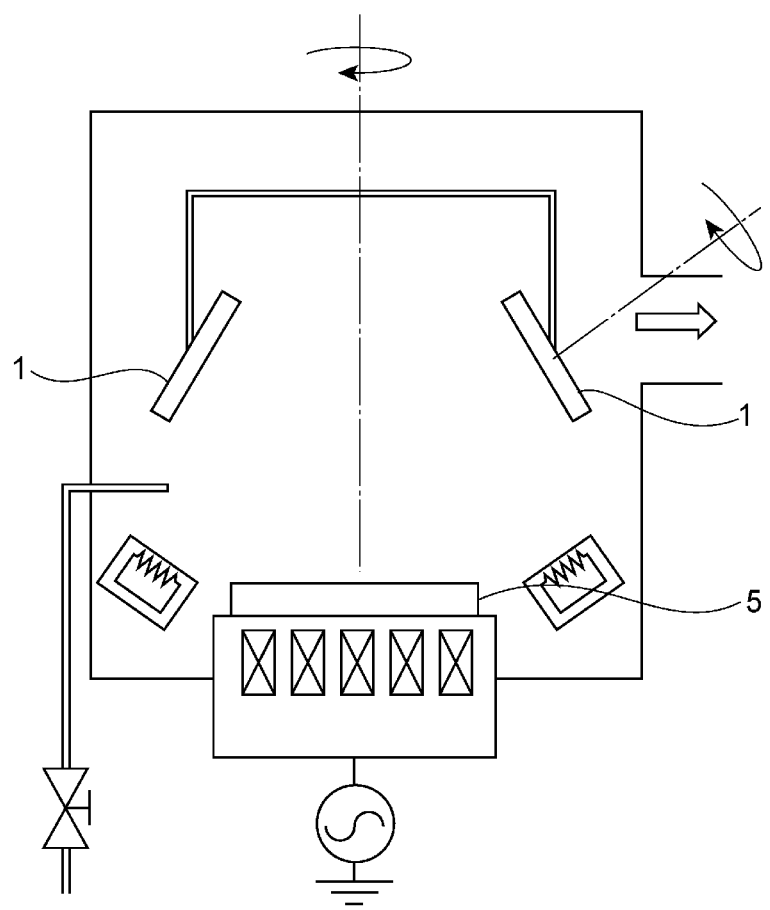
FIG. 7 is a simplified schematic view of an apparatus used at the time of performing film-forming by a unitary sputtering method.

In the sputtering apparatus shown in FIG. 7, a target 5 composed of an alloy of Al, Mg and Nb is used to form a film by a unitary sputtering method under a nitrogen ($N_2$) gas atmosphere. In the unitary sputtering method, the adjustment of contents of Al, Mg and Nb can be performed by preparing alloys differing in contents of Al, Mg and Nb in advance.

Moreover, in a unitary sputtering method using a target composed of an alloy of Al, Mg and Nb, a film with a uniform film thickness distribution and a uniform piezoelectricity distribution can be formed on a large-sized wafer such as a 6-inch wafer and an 8-inch wafer. Since a target composed of an alloy of Sc and Al is used for an Sc-containing AlN and the target is very expensive, by using the target 5 composed of an alloy of Al, Mg and Nb, the product price can be remarkably lowered.

In this connection, the sputtering may be performed under a mixed gas atmosphere of $N_2$ gas and argon (Ar) gas instead of under an $N_2$ gas atmosphere. Moreover, with regard to the temperature of the substrate 1, it is preferred that the sputtering be performed at room temperature to 450° C.

(Piezoelectric Element)

The piezoelectric element according to the present invention includes the above-described piezoelectric thin film according to the present invention and first and second electrodes provided so as to be brought into contact with the piezoelectric thin film. Hereinafter, specific embodiments in which the piezoelectric element according to the present invention is used will be described with reference to the drawings.

First Embodiment

Figure 8:
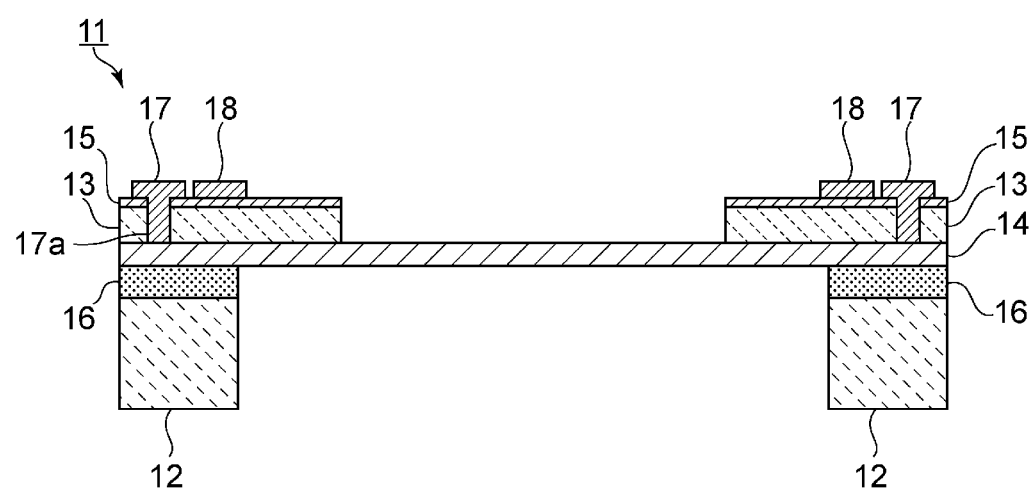
FIG. 8 is a sectional view of a piezoelectric microphone in accordance with a first embodiment which is prepared with the piezoelectric element according to the present invention.

FIG. 8 is a sectional view of a piezoelectric microphone 11 in accordance with a first embodiment. The piezoelectric microphone 11 is constituted of a cylindrical support 12, a silicon oxide film 16, first and second electrodes 14 and 15, a piezoelectric thin film 13 and first and second connection electrodes 17 and 18.

The cylindrical support 12 is composed of appropriate materials such as high-resistance silicon, glass and GaAs. In the present embodiment, the cylindrical support 12 is composed of silicon. On the upper face of the cylindrical support 12, the silicon oxide film 16 is provided so as to cover the cylindrical support 12.

On the silicon oxide film 16, the first electrode 14 is provided. The first electrode 14 has a circular plate-like shape. The first electrode 14 is provided so as to close an opening part of the cylindrical support 12. Moreover, the first electrode 14 is a part that vibrates when externally applied with sound pressure.

On the first electrode 14, the piezoelectric thin film 13 with a doughnut plate-like shape is provided. On the upper face of the piezoelectric thin film 13, the second electrode 15 is provided so as to cover the piezoelectric thin film 13.

In the piezoelectric microphone 11 in accordance with the present embodiment, the piezoelectric thin film 13 is deformed when the first electrode 14 vibrates due to external sound pressure. And then, depending on the deformation of the piezoelectric thin film 13, an electrical signal corresponding to the sound pressure can be obtained from the first and second electrodes 14 and 15.

On the upper face of the second electrode 15, the first and second connection electrodes 17 and 18 for being connected to external electrodes are provided. The first connection electrode 17 has a viahole electrode part 17a. The first and second connection electrodes 17 and 18 are provided so that the first connection electrode 17 and the second connection electrode 18 are connected to the first electrode 14 and the second electrode 15, respectively.

In the present embodiment, the first electrode 14 is constituted of phosphorus-doped Si with a resistivity of less than or equal to 1.5 mΩcm. Moreover, the second electrode 15 is constituted of Al. In this connection, although the thicknesses of respective members are not particularly limited, for example, in the present embodiment, one with a thickness of 400 nm, one with a thickness of 500 nm and one with a thickness of 50 nm are used as the first electrode 14, the piezoelectric thin film 13 and the second electrode 15, respectively.

Moreover, the above-mentioned piezoelectric thin film 13 is a piezoelectric thin film 13 constituted of the above-described AlN containing Mg and Nb according to the present invention. As such, the case is larger in the piezoelectric coefficient $d_{33}$ than the case in which a piezoelectric thin film constituted of an AlN is used. Accordingly, the piezoelectric microphone 11 in accordance with the first embodiment is a microphone with high sensitivity.

Second Embodiment

Figure 9A:
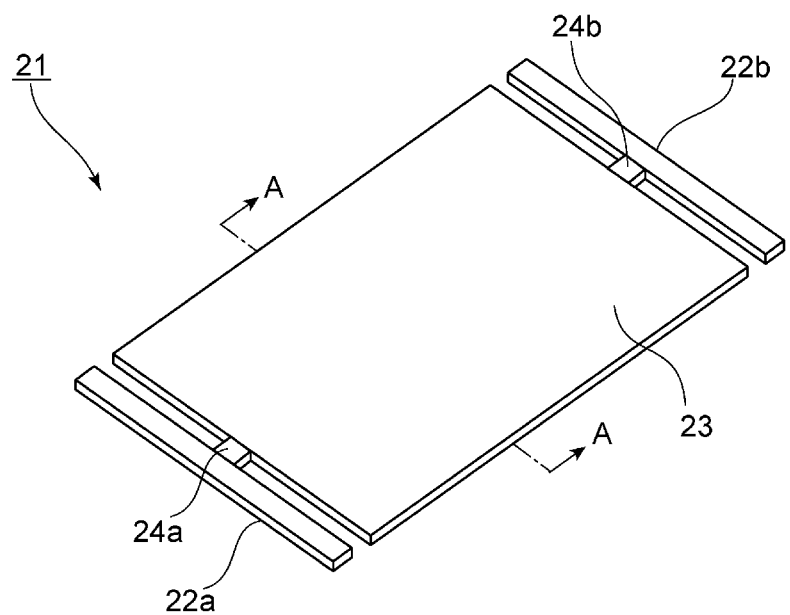
FIG. 9(a) is a perspective view of a width-broadening vibrator in accordance with a second embodiment which is prepared with the piezoelectric element according to the present invention.

FIG. 9(a) is a perspective view of a width-broadening vibrator 21 in accordance with a second embodiment. The width-broadening vibrator 21 is a piezoelectric vibrator utilizing width-broadening vibration. The width-broadening vibrator 21 includes support parts 22a and 22b, a vibration plate 23 as a vibrating body and connection parts 24a and 24b.

The vibration plate 23 has a rectangular plate-like shape and has a lengthwise direction and a widthwise direction. The vibration plate 23 is connected to the support parts 22a and 22b respectively through the connection parts 24a and 24b. That is, the vibration plate 23 is supported by the support parts 22a and 22b. The vibration plate 23 is a vibrating body that vibrates in the widthwise direction at a width-broadening vibration mode when applied with an alternating electric field.

One end of each of the connection parts 24a and 24b is connected to the center of each of side faces in respective short sides of the vibration plate 23. The center of each of side faces in respective short sides of the vibration plate 23 serves as a node of the width-broadening vibration.

Each of the support parts 22a and 22b is connected to the other end of each of the connection parts 24a and 24b. Each of the support parts 22a and 22b is allowed to extend on both sides of each of the connection parts 24a and 24b. Although the length of each of the support parts 22a and 22b is not particularly limited, in the present embodiment, each of the support parts 22a and 22b has the same length as that of the short side of the vibration plate 23.

Figure 9B:
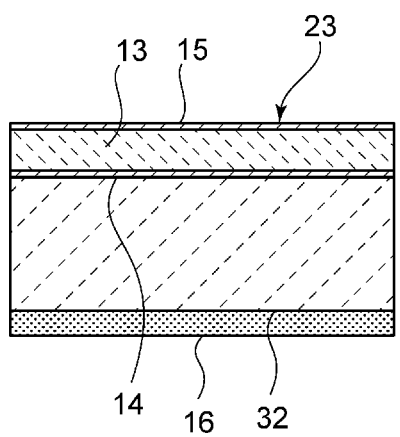
FIG. 9(b) is a sectional view of a part taken along the line A-A shown in FIG. 9(a).

FIG. 9(b) is a sectional view of a part taken along the line A-A shown in FIG. 9(a). As shown in FIG. 9(b), the vibration plate 23 is constituted of a silicon oxide film 16, a substrate 32, first and second electrodes 14 and 15 and a piezoelectric thin film 13.

More specifically, the piezoelectric thin film 13 is provided on the substrate 32. The first and second electrodes 14 and 15 are provided so as to allow the piezoelectric thin film 13 to be sandwiched therebetween. The silicon oxide film 16 is provided below the substrate 32.

In the present embodiment, the substrate 32 is an n-type Si layer of the resistivity: 1 mΩcm and the concentration: $7 \times 10^{19}/cm^3$.

In this connection, between the first electrode 14 and the second electrode 15, a seed layer which is a protective layer and is not illustrated may be provided.

In the present embodiment, each of the first and second electrodes 14 and 15 is constituted of Mo. Moreover, the seed layer is constituted of an AlN. In this connection, although the thicknesses of respective members are not particularly limited, for example, in the present embodiment, one with a thickness of 10 μm, one with a thickness of 400 nm, one with a thickness of 100 nm, one with a thickness of 1000 nm, one with a thickness of 50 nm and one with a thickness of 20 nm are used as the substrate 32, the silicon oxide film 16, the first electrode 14, the piezoelectric thin film 13, the second electrode 15 and the seed layer, respectively.

In this connection, also in the second embodiment, the above-mentioned piezoelectric thin film 13 is constituted of a piezoelectric thin film 13 composed of the AlN containing Mg and Nb according to the present invention. As such, the case is larger in the piezoelectric coefficient $d_{33}$ than the case in which a piezoelectric thin film constituted of an AlN is used. Accordingly, a vibrator with a small resonance resistance in the wide band is obtained, and a TCXO with a wide frequency variable range and a low power consumption is obtained.

Third Embodiment

Figure 10:
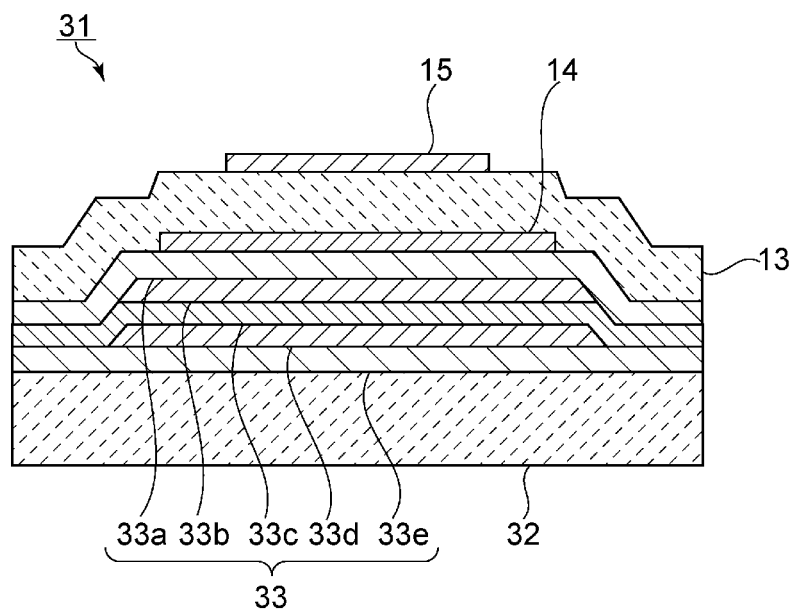
FIG. 10 is a sectional view of a thickness longitudinal vibrator in accordance with a third embodiment which is prepared with the piezoelectric element according to the present invention.

In FIG. 10, a sectional view of a thickness longitudinal vibrator 31 in accordance with a third embodiment is shown. The thickness longitudinal vibrator 31 is a piezoelectric vibrator having an acoustic reflection layer 33. The thickness longitudinal vibrator 31 is constituted of a substrate 32, an acoustic reflection layer 33, a piezoelectric thin film 13 and first and second electrodes 14 and 15.

The acoustic reflection layer 33 is provided on the upper face of the substrate 32. The acoustic reflection layer 33 has a structure in which relatively high acoustic impedance layers 33b and 33d and relatively low acoustic impedance layers 33a, 33c and 33e are alternately layered.

The piezoelectric thin film 13 is provided on the acoustic reflection layer 33. Moreover, the first and second electrodes 14 and 15 are provided so as to allow the piezoelectric thin film 13 to be sandwiched therebetween.

In the present embodiment, each of the first and second electrodes 14 and 15 is constituted of molybdenum. Moreover, each of the relatively high acoustic impedance layers 33b and 33d is constituted of tungsten, and each of the relatively low acoustic impedance layers 33a, 33c and 33e is formed of a silicon oxide.

Even in a known piezoelectric vibrator having such an acoustic reflection layer 33, by adopting the piezoelectric thin film 13 composed of an AlN containing Mg and Nb according to the present invention, it is possible to prepare a filter/DPX capable of achieving both the wide band and satisfactory temperature characteristics.

The piezoelectric element according to the present invention is not limited to the above-described first to third embodiments, and for example, the piezoelectric element can be used in various applications such as a gyro sensor as a high-sensitivity sensor and an acceleration sensor.

Next, a specific example of experiment will be described.

(Example of Experiment)

Under the following conditions, a first target composed of aluminum, a second target composed of magnesium and a third target composed of niobium are used to form a film by a ternary sputtering method.

Substrate temperature: 400° C.
Ar/N$_2$ gas ratio: 60/40
Gas pressure: 0.45 Pa
Composition: Mg$_{0.35}$Nb$_{0.20}$Al$_{0.45}$N The piezoelectric coefficient d$_{33}$ of a piezoelectric thin film obtained in Example of experiment was determined to be 20.4 pC/N, and it was confirmed that the piezoelectric coefficient d$_{33}$ was sufficiently increased as compared with the piezoelectric coefficient d$_{33}$ of the AlN (6 pC/N).

DESCRIPTION OF REFERENCE SYMBOLS

1 . . . Substrate
2 . . . First target
3 . . . Second target
4 . . . Third target
5 . . . Target composed of alloy of aluminum, magnesium and niobium
11 . . . Piezoelectric microphone
21 . . . Width-broadening vibrator
31 . . . Thickness longitudinal vibrator
12 . . . Cylindrical support
13 . . . Piezoelectric thin film
14 . . . First electrode
15 . . . Second electrode
16 . . . Silicon oxide film
17, 18 . . . First and second connection electrodes
17a . . . Viahole electrode part
22a, 22b . . . Support parts
23 . . . Vibration plate
24a, 24b . . . Connection parts
32 . . . Substrate
33 . . . Acoustic reflection layer
33a, 33c, 33e . . . Relatively low acoustic impedance layers
33b, 33d . . . Relatively high acoustic impedance layers

The invention claimed is:

1. A piezoelectric film comprising:
aluminum nitride;
magnesium; and
31 to 120 atomic percent of niobium relative to 100 atomic percent of the magnesium,
wherein a total content of the magnesium and the niobium relative to a total sum of the magnesium, the niobium and the aluminum nitride falls within a range of 10 to 67 atomic percent, and
wherein the niobium includes pentavalent niobium and tetravalent niobium.

2. The piezoelectric film according to claim 1, wherein the total content of the magnesium and the niobium falls within the range of 30 to 63 atomic percent.

3. The piezoelectric film according to claim 2, wherein the piezoelectric film contains 44 to 87 atomic percent of the niobium relative to 100 atomic percent of the magnesium.

4. The piezoelectric film according to claim 1, wherein the piezoelectric film contains 44 to 87 atomic percent of the niobium relative to 100 atomic percent of the magnesium.

5. A piezoelectric element comprising:
a piezoelectric film according to claim 1; and
first and second electrodes in contact with the piezoelectric film.

* * * * *